(12) United States Patent
Fujiwara et al.

(10) Patent No.: US 12,080,341 B2
(45) Date of Patent: *Sep. 3, 2024

(54) MEMORY DEVICE INCLUDING DUAL CONTROL CIRCUITS

(71) Applicant: TAIWAN SEMICONDUCTOR MANUFACTURING COMPANY LTD., Hsinchu (TW)

(72) Inventors: Hidehiro Fujiwara, Hsin-Chu (TW); Yen-Huei Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 563 days.

This patent is subject to a terminal disclaimer.

(21) Appl. No.: 17/141,124

(22) Filed: Jan. 4, 2021

(65) Prior Publication Data

US 2021/0125665 A1   Apr. 29, 2021

Related U.S. Application Data

(62) Division of application No. 16/513,494, filed on Jul. 16, 2019, now Pat. No. 10,885,973.

(60) Provisional application No. 62/712,489, filed on Jul. 31, 2018.

(51) Int. Cl.
*G11C 11/419* (2006.01)
*G11C 11/412* (2006.01)
*H10B 10/00* (2023.01)

(52) U.S. Cl.
CPC .......... *G11C 11/419* (2013.01); *G11C 11/412* (2013.01); *H10B 10/12* (2023.02)

(58) Field of Classification Search
CPC ... G11C 11/412; G11C 11/418; G11C 11/419; H10B 10/12
USPC .......................................................... 365/154
See application file for complete search history.

(56) References Cited

U.S. PATENT DOCUMENTS

| 5,317,536 A * | 5/1994 | Aoyama | G11C 8/16 365/230.01 |
| 5,335,199 A * | 8/1994 | Aoyama | G11C 7/1075 365/189.04 |
| 2012/0195151 A1* | 8/2012 | Ostermayr | G11C 11/412 365/230.05 |
| 2017/0186483 A1* | 6/2017 | Singh | H01L 23/528 |
| 2017/0330613 A1* | 11/2017 | Yeh | H03K 3/0315 |
| 2018/0218177 A1* | 8/2018 | Kuenemund | H04L 9/0861 |

* cited by examiner

*Primary Examiner* — Sung Il Cho
(74) *Attorney, Agent, or Firm* — WPAT LAW; Anthony King

(57) ABSTRACT

A memory device is provided. The memory device comprises a memory cell array, a first control circuit, and a second control circuit. The memory cell array has a plurality of memory cells, wherein each of the plurality of memory cells comprises a first port and a second port. The first control circuit is disposed on a first side of the memory cell array and is arranged to electrically connect to the plurality of first ports. The second control circuit is disposed on the first side of the memory cell array and is arranged to electrically connect to the plurality of second ports. The plurality of first ports are different from the plurality of second ports.

20 Claims, 9 Drawing Sheets

MEMORY DEVICE INCLUDING DUAL CONTROL CIRCUITS

PRIORITY CLAIM AND CROSS-REFERENCE

This application claims the benefit of U.S. Provisional Application No. 62/712,489, filed on Jul. 31, 2018, and U.S. application Ser. No. 16/513,494, filed on Jul. 16, 2019, the disclosure of which is hereby incorporated by reference in its entirety.

BACKGROUND

Semiconductor memory is an electronic data storage device implemented on a semiconductor-based integrated circuit. Semiconductor memory is made in many different types and technologies. Semiconductor memory has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

Static random access memories (SRAM) are commonly used in integrated circuits. Embedded SRAM is particularly popular in high speed communication, image processing and system on chip (SOC) applications. SRAM cells have the advantageous feature of holding data without requiring a refresh. Typically, a SRAM cell includes two pass-gate transistors, through which a bit can be read from or written into the SRAM cell. This type of SRAM cell is referred to as a single port SRAM cell. Another type of SRAM cell is referred to as dual port SRAM cell, which includes four pass-gate transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
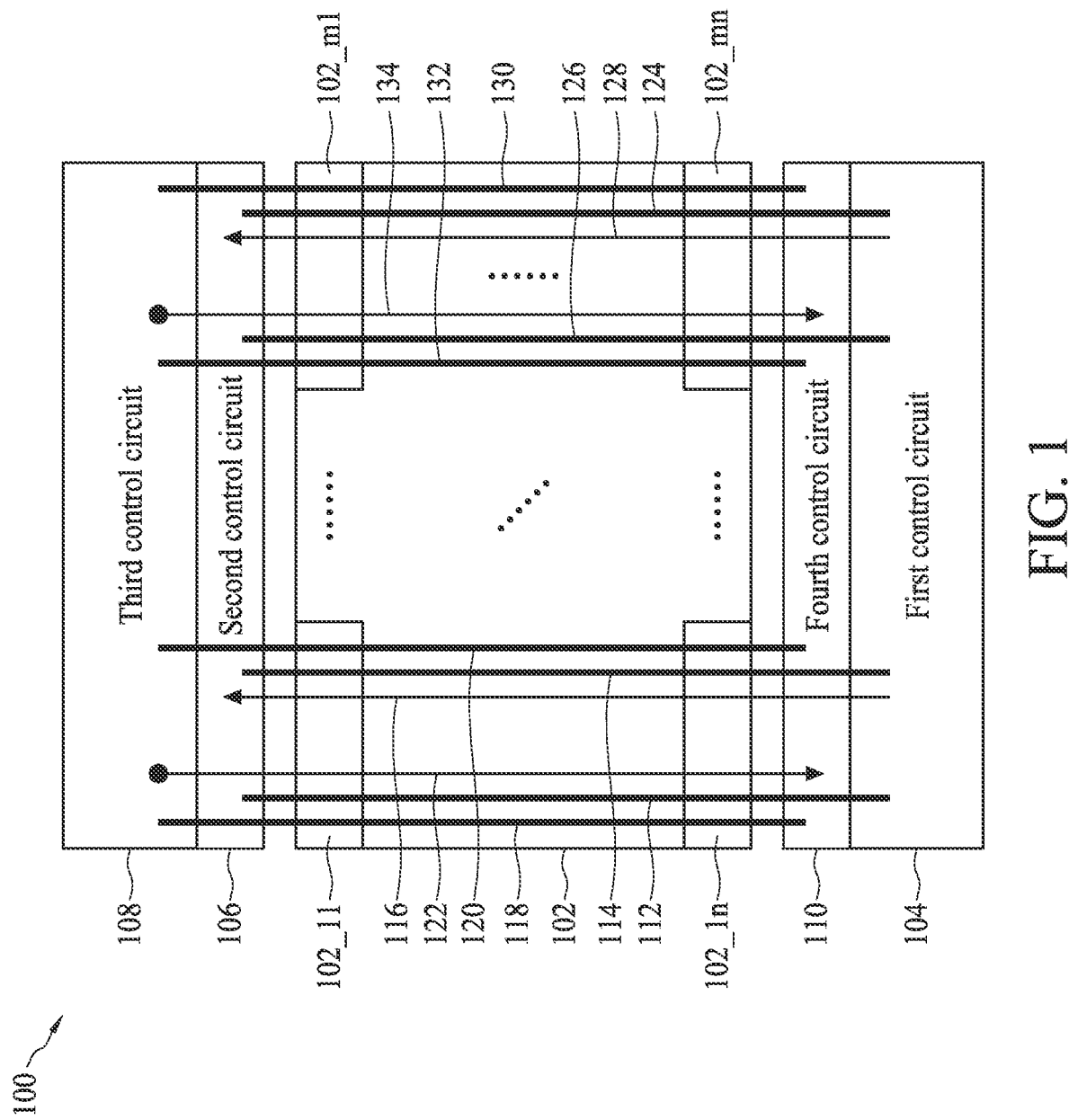
FIG. 1 is a diagram illustrating a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below." "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The following disclosure describes aspects of a static random access memory (SRAM). Specifically, the disclosure describes different embodiments related to an SRAM write operation. For ease of explanation, certain SRAM circuit elements and control logic are disclosed to facilitate in the description of the different embodiments. A person of ordinary skill in the art may understand that SRAMs also include other circuit elements and control logic. These other circuit elements and control logic are within the spirit and scope of this disclosure.

In addition, a dual-port SRAM cell includes a first port and a second port. The first port may be configured as a read port, and the read port includes a read data line that is configured to carry the data read from the memory cell. The second port may be configured to be a write port, and the write port includes a write data line that is configured to carry the data to be written to the memory cell. In some configurations, the write data line is precharged and/or kept at a predetermined voltage level when the write data line is not used for writing the memory cell. When a write word line is activated to access another memory cell of the same row, the write data line is also coupled to the memory cell responsive to the activated write word line.

FIG. 1 is a diagram illustrating a memory device 100 in accordance with some embodiments. The memory device 100 may be an SRAM device. The memory device 100 comprises a memory cell array 102, a first control circuit 104, a second control circuit 106, a third control circuit 108, and a fourth control circuit 110. According to some embodiments, the top view shape of the memory cell array 102 may be rectangle or square. However, this is not a limitation of the present disclosure. The top view shape of the memory cell array 102 may be any regular or irregular shape. For example, the shape may be regular hexagon or irregular hexagon. The memory cell array 102 comprises a plurality of memory cells 102_11-102_mn arranged in two dimensional array. According to some embodiments, the parameter "m" (or "n") is an integer ranged from 8 to 512. However, this is not a limitation of the present disclosure. The integer "m" (or "n") may be greater than 512, e.g. 1024.

Figure 2:
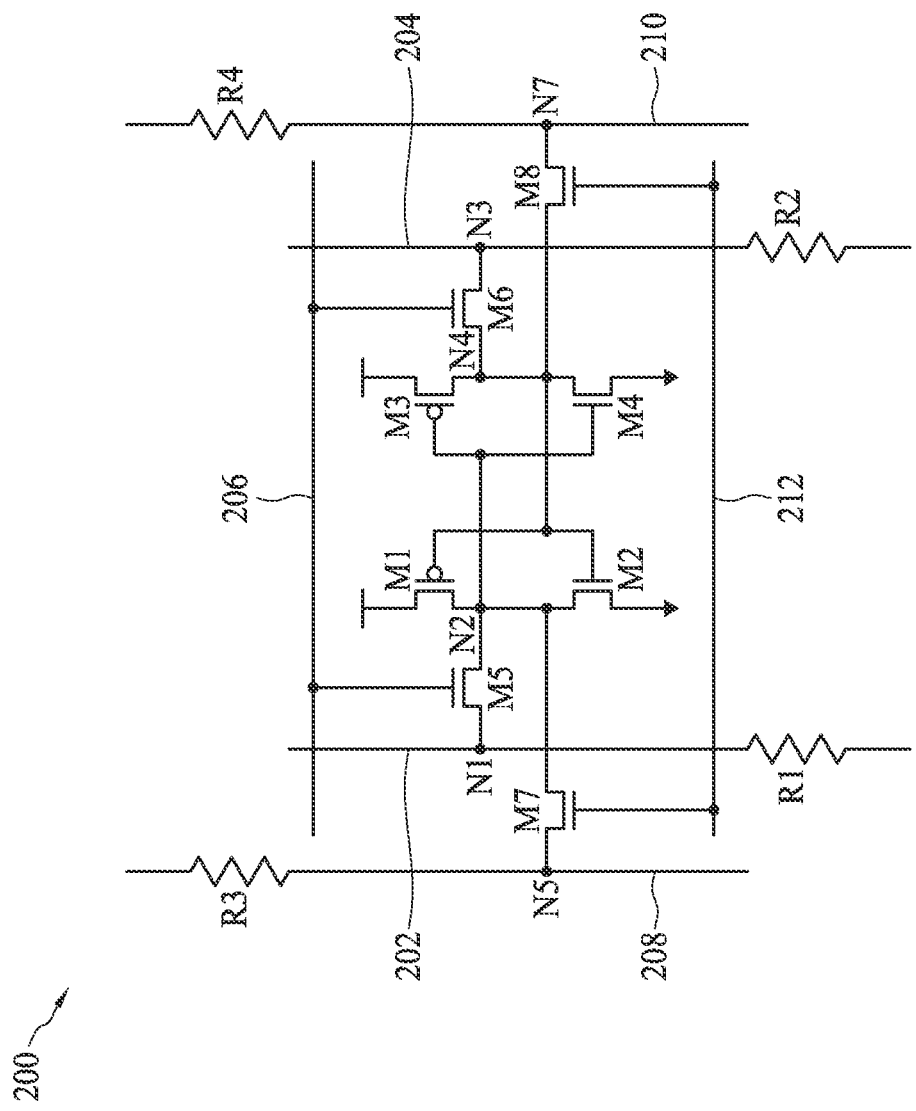
FIG. 2 is a schematic diagram illustrating a memory cell in accordance with some embodiments.

FIG. 2 is a schematic diagram illustrating a memory cell 200 in accordance with some embodiments. The memory cell 200 may be an memory cell in the memory cell array 102. The memory cell 200 may be a dual-port SRAM cell. For example, the SRAM cell may be configured as a "8T" circuit topology, in which "T" is the abbreviation of "transistor". As would be understood by a person of ordinary skill in the art, the SRAM cell can have different circuit topologies. According to some embodiments, the memory cell 200 comprises eight transistors M1-M8, in which the transistors M1 and M3 are p-channel field-effect transistor, and the transistors M2, M4, and M5-M8 are n-channel field-effect transistor. The transistors M1-M4 are configured to be a latch, a cross-latch, or a flip-flop structure. The transistor M5 is configured to be a switch between a node N1 on a first bit line 202 and a node N2 of the latch. The transistor M6 is configured to be a switch between a node N3 on a second bit line 204 and a second node N4 of the latch. The gates of the transistors M5 and M6 are electrically connected to a first word line 206. According to some embodiments, the second bit line 204 is the complement of the first bit line 202. The transistor M7 is configured to be a switch between a node N5 on a third bit line 208 and the node N2 of the latch. The transistor M8 is configured to be a switch between a node N6 on a fourth bit line 210 and the node N4 of the latch. The gates of the transistors M7 and M8 are electrically connected to a second word line 212. According to some embodiments, the fourth bit line 210 is the complement of the third bit line 208.

In addition, the nodes N1 and N3 are configured to be a first port of the memory cell 200, and the nodes N5 and N7 are configured to be a second port of the memory cell 200. However, this is not a limitation of the present disclosure. The first port as well as the second port may be configured to be a read port or a write port of the memory cell 200.

According to some embodiments, the first bit line 202, the second bit line 204, the third bit line 206, and the fourth bit line 208 are four relatively long conductive lines extended from the bottom side to the top side of the memory cell array 102 in order to connect the corresponding nodes of all the memory cells in the same column of the memory cell array 102. Therefore, the first bit line 202, the second bit line 204, the third bit line 206, and the fourth bit line 208 may have relatively large amount of parasitic elements, e.g. parasitic resistor, capacitor, and/or inductor, which may affect the cycle time and/or write time of the memory cell 200. For brevity, in FIG. 2, a first resistor R1, a second resistor R2, a third resistor R3, and a fourth resistor R4 on the first bit line 202, the second bit line 204, the third bit line 206, and the fourth bit line 208 are used to represent the parasitic resistors of the first bit line 202, the second bit line 204, the third bit line 206, and the fourth bit line 208 respectively.

Referring FIG. 1 again, the first control circuit 104 and the fourth control circuit 110 are disposed on a first side of the memory cell array 102, and the second control circuit 106 and the third control circuit 108 are disposed on a second side, which is opposite to the first side, of the memory cell array 102. The second control circuit 106 is disposed between the memory cell array 102 and the third control circuit 108, and the fourth control circuit 110 is disposed between the memory cell array 102 and the first control circuit 104. According to some embodiments, the first control circuit 104 and the fourth control circuit 110 are disposed on the bottom side of the memory cell array 102, and the second control circuit 106 and the third control circuit 108 are disposed on the top side of the memory cell array 102. However, this is not a limitation of the present disclosure. The first control circuit 104 and the fourth control circuit 110 may be disposed on the right side of the memory cell array 102, and the second control circuit 106 and the third control circuit 108 may be disposed on the left side of the memory cell array 102.

According to some embodiments, the first control circuit 104 and the second control circuit 106 are arranged to control the first ports of memory cells 102_11-102_1n of the first column via a first bit line 112, a second bit line 114, and at least one conductive line 116. The first control circuit 104 is arranged to control the second control circuit 106 via the at least one conductive line 116. The third control circuit 108 and the fourth control circuit 110 are arranged to control the second ports of memory cells 102_11-102_1n of the first column via a third bit line 118, a fourth bit line 120, and at least one conductive line 122. The third control circuit 108 is arranged to control the fourth control circuit 110 via the at least one conductive line 122.

Similarly, the first control circuit 104 and the second control circuit 106 are also arranged to control the first ports of memory cells 102_11-102_1n of other columns via two bit lines and a conductive line, and the third control circuit 108 and the fourth control circuit 110 are also arranged to control the second ports of memory cells 102_11-102_1n of other columns via two bit lines and a conductive line. For example, the first control circuit 104 and the second control circuit 106 are arranged to control the first ports of memory cells 102_m1-102_mn of the last column via a first bit line 124, a second bit line 126, and at least one conductive line 128. The third control circuit 108 and the fourth control circuit 110 are arranged to control the second ports of memory cells 102_11-102_1n of the last column via a third bit line 130, a fourth bit line 132, and at least one conductive line 134.

Figure 3:
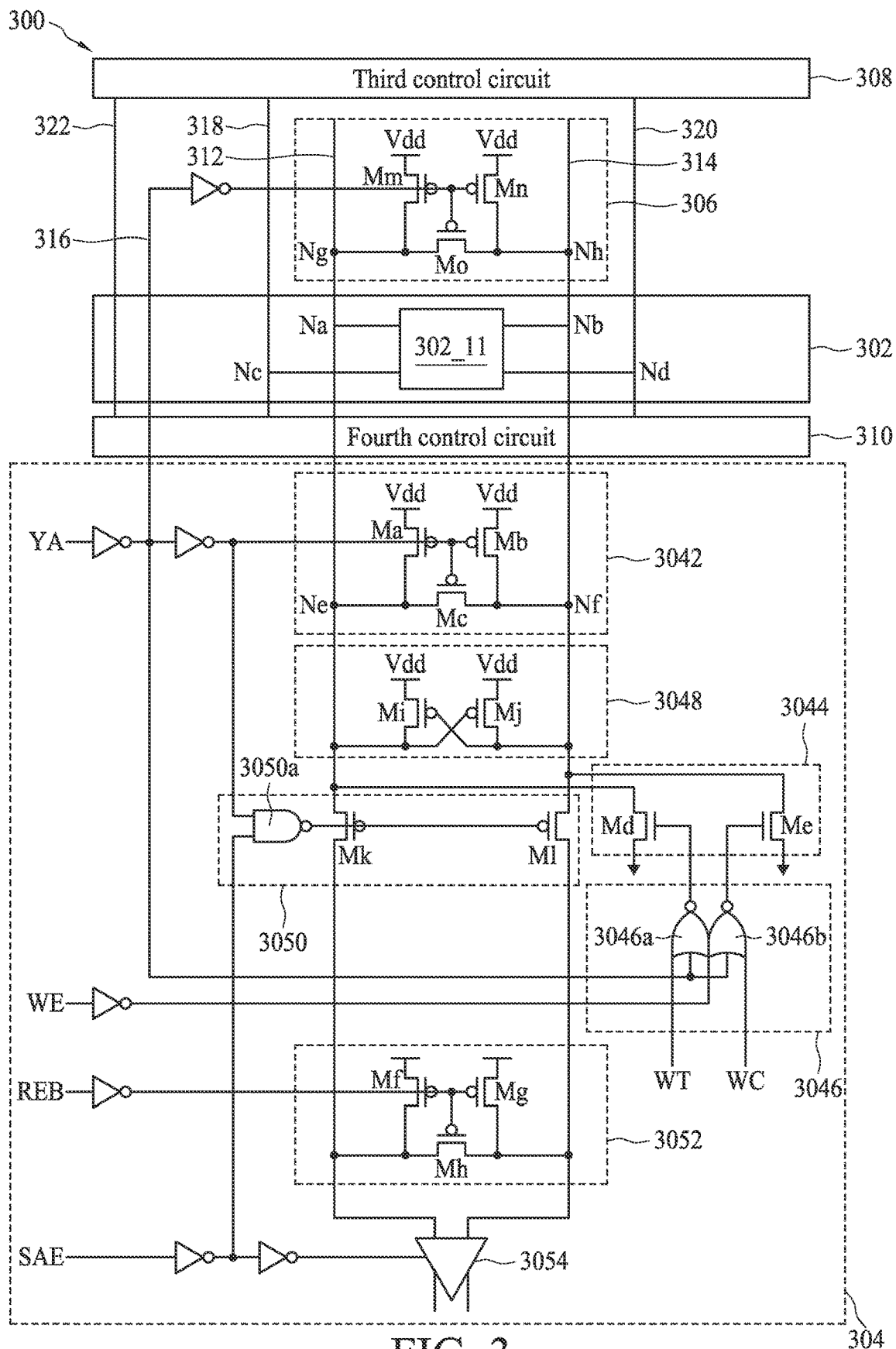
FIG. 3 is a schematic diagram illustrating a portion of the memory device of FIG. 1 in accordance with some embodiments.

FIG. 3 is a schematic diagram illustrating a portion 300 of the memory device 100 in accordance with some embodiments. The portion 300 of the memory device 100 comprises a memory cell array 302, a portion (i.e. the control circuit 304) of the first control circuit 104, a portion (i.e. the control circuit 306) of the second control circuit 106, a portion (i.e. the control circuit 308) of the third control circuit 108, and a portion (i.e. the control circuit 310) of the fourth control circuit 110. For the purpose of description, the memory cell array 302 merely comprises a memory cell 302_11, which is located on the top left corner of the memory cell array 302. The configuration of the memory cell 302_11 is similar to the memory cell 200, thus the detailed description is omitted here for brevity. The memory cell 302_11 comprises a first port (i.e. Na and Nb) connecting to the first bit line 312 and the second bit line 314 respectively, and a second port (i.e. Nc and Nd) connecting to the third bit line 318 and the fourth bit line 320 respectively. The first bit line 312 and the second bit line 314 are arranged to extend from the control circuit 304 to the control circuit 306, and the third bit line 318 and the fourth bit line 320 are arranged to extend from the control circuit 308 to the control circuit 310.

According to some embodiments, the control circuit 304 comprises a first precharging and equalizing circuit 3042, a write driver 3044, a first control logic 3046, a latching circuit 3048, a second control logic 3050, a second precharging and equalizing circuit 3052, and a sensing amplifier 3054.

The first precharging and equalizing circuit 3042 comprises three p-channel transistors Ma, Mb, and Mc, in which the p-channel transistors Ma and Mb are configured to be a precharger, and the p-channel transistor Mc is configured to be an equalizer. The first precharging and equalizing circuit 3042 is controlled by a pre-charge control signal YA. When the p-channel transistors Ma, Mb, and Mc are turned on, the p-channel transistors Ma and Mb are arranged to charge the voltages on the nodes Ne and Nf on the first bit line 312 and the second bit line 314 to the supply voltage level Vdd respectively, and the p-channel transistor Mc is arranged to equalize the voltages on the nodes Ne and Nf.

The write driver 3044 comprises two n-channel transistors Md and Me. The write driver 3044 is controlled by the first control logic 3046. The first control logic 3046 comprises two NOR gates 3046a and 3046b. Each of the NOR gates 3046a and 3046b has three input terminals. The first terminals of the NOR gates 3046a and 3046b are arranged to receive a first writing data WT and a second writing data WC, in which the first writing data WT may be complemented to the second writing data WC. The second terminals of the NOR gates 3046a and 3046b are coupled to the pre-charge control signal YA. The third terminals of the NOR gates 3046a and 3046b are coupled to a write enable signal WE.

The latching circuit 3048 comprises two p-channel transistors Mi and Mj. The p-channel transistors Mi and Mj are arranged to latch the voltage on one of the first bit line 312 and the second bit line 314 into the supply voltage level Vdd.

The second control logic 3050 comprises a NAND gate 3050a and two p-channel transistors Mk and Ml. The p-channel transistors Mk and Ml are controlled by the output of the NAND gate 3050a. The p-channel transistors Mk and Ml are configured to be two switches connecting between the first bit line 312 and the second bit line 314 and the second precharging and equalizing circuit 3052. The NAND gate 3050a has two input terminals, in which the first input terminal is coupled to the pre-charge control signal YA, and the second input terminal is coupled to a sensing amplifier activation signal SAE.

The second precharging and equalizing circuit 3052 comprises three p-channel transistors Mf, Mg, and Mh, in which the p-channel transistors Mf and Mg are configured to be a precharger, and the p-channel transistor Mh is configured to be an equalizer. The second precharging and equalizing circuit 3052 is controlled by a read enable signal REB. The operation of the second precharging and equalizing circuit 3052 is similar to the first precharging and equalizing circuit 3042, thus the detailed description is omitted here for brevity.

The sensing amplifier 3054 is a differential amplifier having two input terminals coupled to the first bit line 312 and the second bit line 314 respectively. The sensing amplifier 3054 is controlled by the sensing amplifier activation signal SAE for outputting a differential output signals according to the differential input signals.

According to some embodiments, the control circuit 306 comprises three p-channel transistors Mm, Mn, and Mo, in which the p-channel transistors Mm and Mn are configured to be a precharger, and the p-channel transistor Mo is configured to be an equalizer. The control circuit 306 is controlled by the pre-charge control signal YA. When the p-channel transistors Mm, Mn, and Mo are turned on, the p-channel transistors Mm and Mn are arranged to charge the voltages on the nodes Ng and Nh on the first bit line 312 and the second bit line 314 to the supply voltage level Vdd respectively, and the p-channel transistor Mo is arranged to equalize the voltages on the nodes Ng and Nh.

According to some embodiments, the control circuit 306 is a duplicate of the first precharging and equalizing circuit 3042, in which the control circuit 306 is disposed on the top side of the memory cell array 302, and the first precharging and equalizing circuit 3042 is disposed on the bottom side of the memory cell array 302. Accordingly, a conductive line 316 is arranged to extend to the top side from the bottom side of the memory cell array 402 for transmitting the pre-charge control signal YA to the control circuit 306.

During the reading operation of the memory cell 302_11, the first precharging and equalizing circuit 3042 precharges and equalizes the voltages on the nodes Ne and Nf on the first bit line 312 and the second bit line 314 to the supply voltage level Vdd. Ideally, the voltages on the nodes Na and Nb on the first bit line 312 and the second bit line 314 should reach the supply voltage level Vdd instantly. However, due to the parasitic elements of the first bit line 312 and the second bit line 314, the voltages on the nodes Na and Nb on the first bit line 312 and the second bit line 314 may not reach the supply voltage level Vdd instantly. To speed up the precharging and equalizing operation, another precharging and equalizing circuit (i.e. the control circuit 306) is disposed on the opposite side of the first precharging and equalizing circuit 3042 to precharge the voltages on the nodes Ng and Nh to the supply voltage level Vdd during the reading operation of the memory cell 302_11. During the reading operation of the memory cell 302_11, the first precharging and equalizing circuit 3042 precharges the voltages on the nodes Ne and Nf to the supply voltage level Vdd on the bottom side of the memory cell array 302 meanwhile the control circuit 306 precharges the voltages on the nodes Ng and Nh to the supply voltage level Vdd on the top side of the memory cell array 302. Therefore, the voltages on the nodes Na and Nb, which are connected to the first ports of the memory cell 302_11, may reach the supply voltage level Vdd in a relatively short time. Accordingly, the cycle time of the memory cell 302_11 may be reduced.

According to some embodiments, the control circuit 308, the control circuit 310, and the conductive line 322 may similar to the control circuit 304, the control circuit 306, and the conductive line 316 respectively, thus the detailed description is omitted here for brevity.

Figure 4:
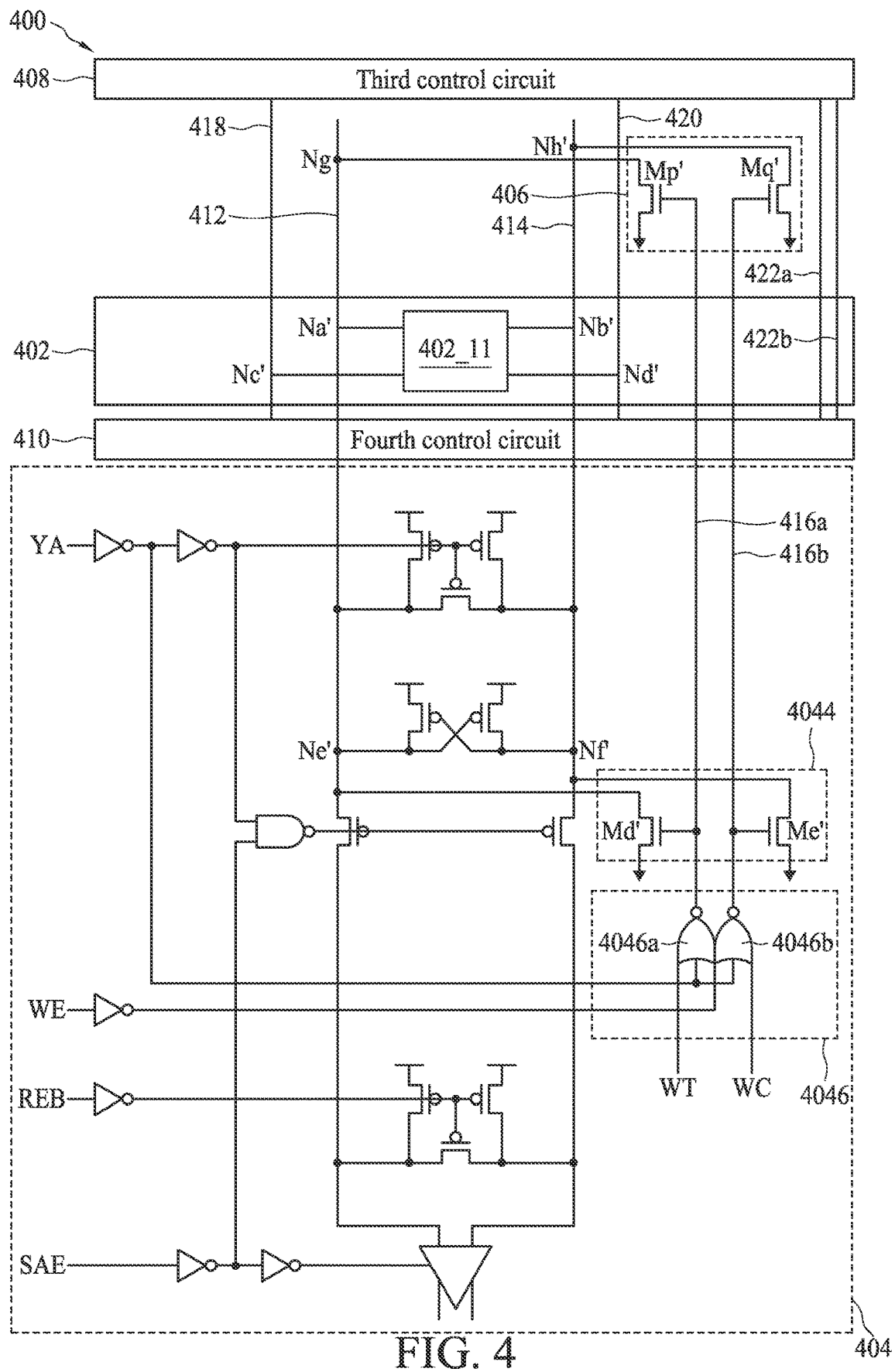
FIG. 4 is a schematic diagram illustrating a portion of the memory device of FIG. 1 in accordance with some embodiments.

FIG. 4 is a schematic diagram illustrating a portion 400 of the memory device 100 in accordance with some embodiments. The portion 400 of the memory device 100 comprises a memory cell array 402, a portion (i.e. the control circuit 404) of the first control circuit 104, a portion (i.e. the control circuit 406) of the second control circuit 106, a portion (i.e. the control circuit 408) of the third control circuit 108, and a portion (i.e. the control circuit 410) of the fourth control circuit 110. For the purpose of description, the memory cell array 402 merely comprises a memory cell 402l1, which is located on the top left corner of the memory cell array 402. The configuration of the memory cell 402_1 is similar to the memory cell 200, thus the detailed description is omitted here for brevity. The memory cell 402_11 comprises a first port (i.e. Na' and Nb') connecting to the first bit line 412 and the second bit line 414 respectively, and a second port (i.e. Nc' and Nd') connecting to the third bit line 418 and the fourth bit line 420 respectively. The first bit line 412 and the second bit line 414 are arranged to extend from the control circuit 404 to the control circuit 406, and the third bit line 418 and the fourth bit line 420 are arranged to extend from the control circuit 408 to the control circuit 410.

According to some embodiments, the control circuit 404 at least comprises a write driver 4044 and a control logic 4046. The write driver 4044 comprises two n-channel transistors Md' and Me'. The write driver 4044 is controlled by the control logic 4046. The control logic 4046 comprises two NOR gates 4046a and 4046b. Each of the NOR gates 4046a and 4046b has three input terminals. The first terminals of the NOR gates 4046a and 4046b are arranged to receive a first writing data WT and a second writing data WC, in which the first writing data WT may be complemented to the second writing data WC. The second terminals of the NOR gates 4046a and 4046b are coupled to the pre-charge control signal YA. The third terminals of the NOR gates 4046a and 4046b are coupled to a write enable signal WE. It is noted that, the control circuit 404 is similar to the control circuit 304, thus the detailed description of other circuits in the control circuit 404 is omitted here for brevity.

The control circuit 406 comprises two n-channel transistors Mp' and Mq', in which the n-channel transistors Mp' and Mq' are configured to be a write driver. The write driver is controlled by the control logic 4046. Therefore, the write driver is controlled by the pre-charge control signal YA, the write enable signal WE, the first writing data WT, and the second writing data WC.

According to some embodiments, the control circuit 406 is a duplicate of the write driver 4044, in which the control circuit 406 is disposed on the top side of the memory cell array 402, and the write driver 4044 is disposed on the bottom side of the memory cell array 402. Accordingly, a first conductive line 416a is arranged to extend to the top side from the bottom side of the memory cell array 402 for connecting the gate terminal of the n-channel transistor Mp' to the gate terminal of the n-channel transistor Md', and a second conductive line 416b is arranged to extend to the top side from the bottom side of the memory cell array 402 for connecting the gate terminal of the n-channel transistor Mq' to the gate terminal of the n-channel transistor Me'.

During the writing operation of the memory cell 402_11, the write driver 4044 is arranged to write data into the memory cell 402_11 by outputting a first voltage level (e.g. a high voltage level) and a second voltage level (e.g. a low voltage level) to the nodes Ne' and Nf' of the first bit line 412 and the second bit line 414 respectively. However, due to the parasitic elements of the first bit line 412 and the second bit line 414, the voltages on the nodes Na' and Nb' on the first bit line 412 and the second bit line 414 may not instantly reach the high voltage level and the low voltage level respectively. To speed up the writing operation, another write driver (i.e. the control circuit 406) is disposed on the opposite side of the write driver 4044 to drive the voltages on the nodes Ng' and Nh' to the first voltage level and the second voltage level, respectively, during the writing operation of the memory cell 402_11. During the writing operation of the memory cell 402_11, the write driver 4044 drives the voltages on the nodes Ne' and Nf' to the first voltage level and the second voltage level, respectively, on the bottom side of the memory cell array 402 meanwhile the control circuit 406 drives the voltages on the nodes Ng' and Nh' to the first voltage level and the second voltage level, respectively, on the top side of the memory cell array 402. Therefore, the voltages on the nodes Na' and Nb', which are connected to the write ports of the memory cell 402_11, may reach the first voltage level and the second voltage level in a relatively short time respectively. Accordingly, the writing time of the memory cell 402_11 may be reduced.

According to some embodiments, the control circuit 408, the control circuit 410, and the conductive lines 422a and 422b may similar to the control circuit 404, the control circuit 406, and the conductive lines 416a and 416b respectively, thus the detailed description is omitted here for brevity.

Figure 5:
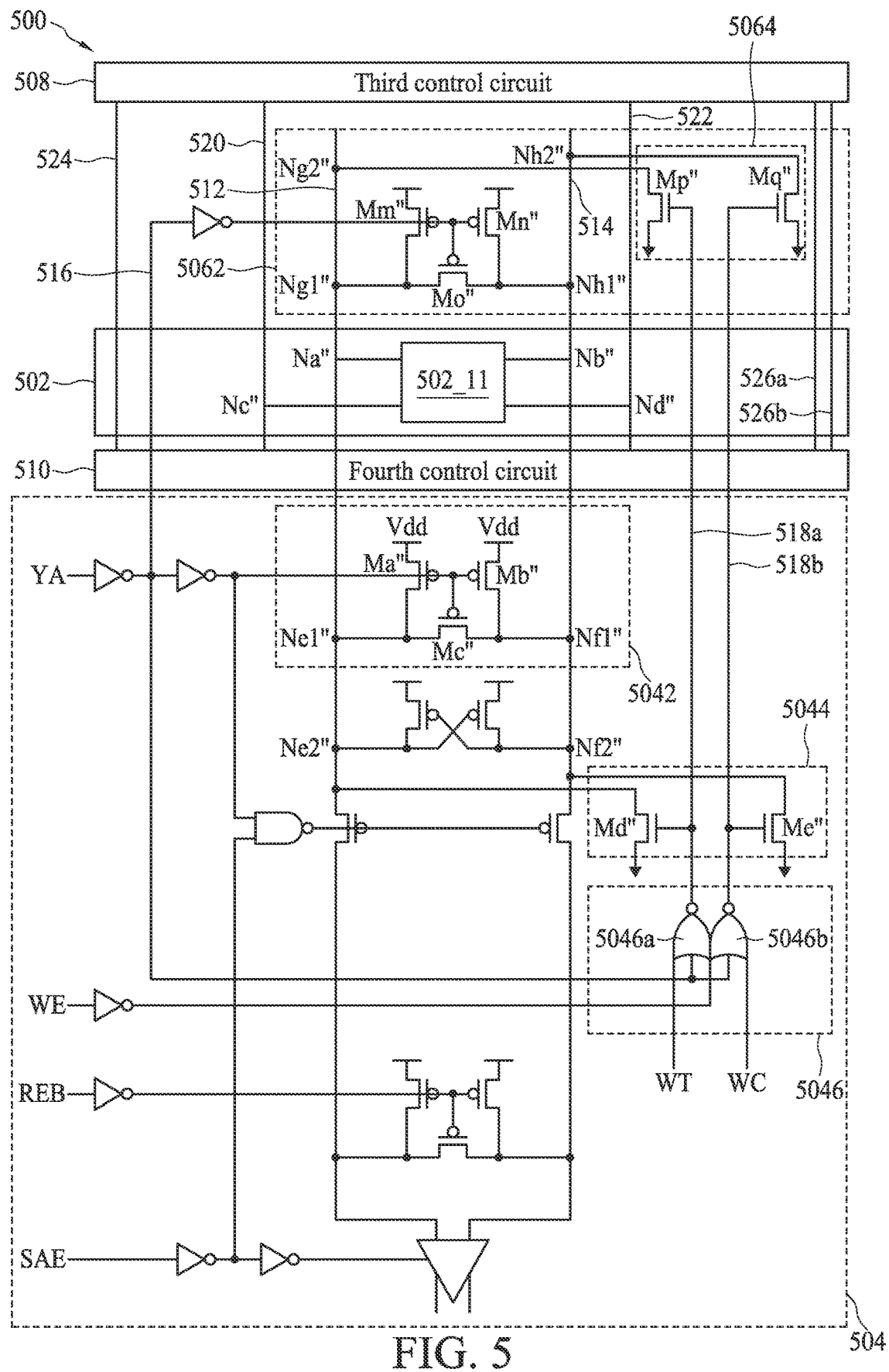
FIG. 5 is a schematic diagram illustrating a portion of the memory device of FIG. 1 in accordance with some embodiments.

FIG. 5 is a schematic diagram illustrating a portion 500 of the memory device 100 in accordance with some embodiments. The portion 500 of the memory device 100 comprises a memory cell array 502, a portion (i.e. the control circuit 504) of the first control circuit 104, a portion (i.e. the control circuit 506) of the second control circuit 106, a portion (i.e. the control circuit 508) of the third control circuit 108, and a portion (i.e. the control circuit 510) of the fourth control circuit 110. For the purpose of description, the memory cell array 502 merely comprises a memory cell 502_11, which is located on the top left corner of the memory cell array 502. The configuration of the memory cell 502_11 is similar to the memory cell 200, thus the detailed description is omitted here for brevity. The memory cell 50211 comprises a first port (i.e. Na" and Nb") connecting to the first bit line 512 and the second bit line 514 respectively, and a second port (i.e. Nc" and Nd") connecting to the third bit line 520 and the fourth bit line 522 respectively. The first bit line 512 and the second bit line 514 are arranged to extend from the control circuit 504 to the control circuit 506, and the third bit line 520 and the fourth bit line 522 are arranged to extend from the control circuit 508 to the control circuit 510.

According to some embodiments, the control circuit 504 at least comprises a precharging and equalizing circuit 5042, a write driver 5044, and a control logic 5046.

The precharging and equalizing circuit 5042 comprises three p-channel transistors Ma", Mb", and Mc", in which the p-channel transistors Ma" and Mb" are configured to be a precharger, and the p-channel transistor Mc" is configured to be an equalizer. The precharging and equalizing circuit 5042 is controlled by a pre-charge control signal YA. When the p-channel transistors Ma", Mb", and Mc" are turned on, the p-channel transistors Ma" and Mb" are arranged to charge the voltages on the nodes Ne1" and Nf1" on the first bit line 512 and the second bit line 514 to the supply voltage level Vdd respectively, and the p-channel transistor Mc" is arranged to equalize the voltages on the nodes Ne1" and Nf1".

The write driver 5044 comprises two n-channel transistors Md" and Me". The write driver 5044 is controlled by the control logic 5046. The control logic 5046 comprises two NOR gates 5046a and 5046b. Each of the NOR gates 5046a and 5046b has three input terminals. The first terminals of the NOR gates 5046a and 5046b are arranged to receive a first writing data WT and a second writing data WC, in which the first writing data WT may be complemented to the second writing data WC. The second terminals of the NOR gates 5046a and 5046b are coupled to the pre-charge control signal YA. The third terminals of the NOR gates 5046a and 5046b are coupled to a write enable signal WE. It is noted that, the control circuit 504 is similar to the control circuit 304, thus the detailed description of other circuits in the control circuit 504 is omitted here for brevity.

According to some embodiments, the control circuit 506 comprises a precharging and equalizing circuit 5062 and a write driver 5064.

The precharging and equalizing circuit 5062 comprises three p-channel transistors Mm", Mn", and Mo", in which the p-channel transistors Mm" and Mn" are configured to be a precharger, and the p-channel transistor Mo" is configured to be an equalizer. The precharging and equalizing circuit 5062 is a duplicate of the precharging and equalizing circuit 5042, in which the precharging and equalizing circuit 5062 is disposed on the top side of the memory cell array 502, and the precharging and equalizing circuit 5042 is disposed on the bottom side of the memory cell array 502. Accordingly, a conductive line 516 is arranged to extend to the top side from the bottom side of the memory cell array 502 for transmitting the pre-charge control signal YA to the precharging and equalizing circuit 5062.

During the reading operation of the memory cell 502_11, the precharging and equalizing circuit 5042 precharges the voltages on the nodes Ne1" and Nf1" to the supply voltage level Vdd on the bottom side of the memory cell array 502 meanwhile the precharging and equalizing circuit 5062 precharges the voltages on the nodes Ng1" and Nh1" to the supply voltage level Vdd on the top side of the memory cell array 502. Therefore, the voltages on the nodes Na" and Nb", which are connected to the first ports of the memory cell 502_11, may reach the supply voltage level Vdd in a relatively short time. Accordingly, the cycle time of the memory cell 50211 may be reduced. The operation of the precharging and equalizing circuit 5062 is similar to the control circuit 306, thus the detailed description is omitted here for brevity.

In addition, the write driver 5064 comprises two n-channel transistors Mp" and Mq". The write driver is controlled by the control logic 5046. Therefore, the write driver 5064 is controlled by the pre-charge control signal YA, the write enable signal WE, the first writing data WT, and the second writing data WC.

According to some embodiments, the write driver 5064 is a duplicate of the write driver 5044, in which the write driver 5064 is disposed on the top side of the memory cell array 502, and the write driver 5044 is disposed on the bottom side of the memory cell array 502. Accordingly, a first conductive line 518a is arranged to extend to the top side from the bottom side of the memory cell array 502 for connecting the gate terminal of the n-channel transistor Mp" to the gate terminal of the n-channel transistor Md", and a second conductive line 518b is arranged to extend to the top side from the bottom side of the memory cell array 502 for connecting the gate terminal of the n-channel transistor Mq" to the gate terminal of the n-channel transistor Me".

During the writing operation of the memory cell 502_11, the write driver 5044 drives the voltages on the nodes Ne2" and Nf2" to the first voltage level and the second voltage level, respectively, on the bottom side of the memory cell array 502 meanwhile the write driver 5064 drives the voltages on the nodes Ng2" and Nh2" to the first voltage level and the second voltage level, respectively, on the top side of the memory cell array 502. Therefore, the voltages on the nodes Na" and Nb", which are connected to the second ports of the memory cell 502_11, may reach the first voltage level and the second voltage level in a relatively short time respectively. Accordingly, the writing time of the memory cell 502_11 may be reduced. The operation of the write driver 5064 is similar to the control circuit 406, thus the detailed description is omitted here for brevity.

According to some embodiments, the control circuit 508, the control circuit 510, and the conductive lines 524, 526a, and 526b may similar to the control circuit 504, the control circuit 506, and the conductive lines 516, 518a and 518b respectively, thus the detailed description is omitted here for brevity.

Figure 6:
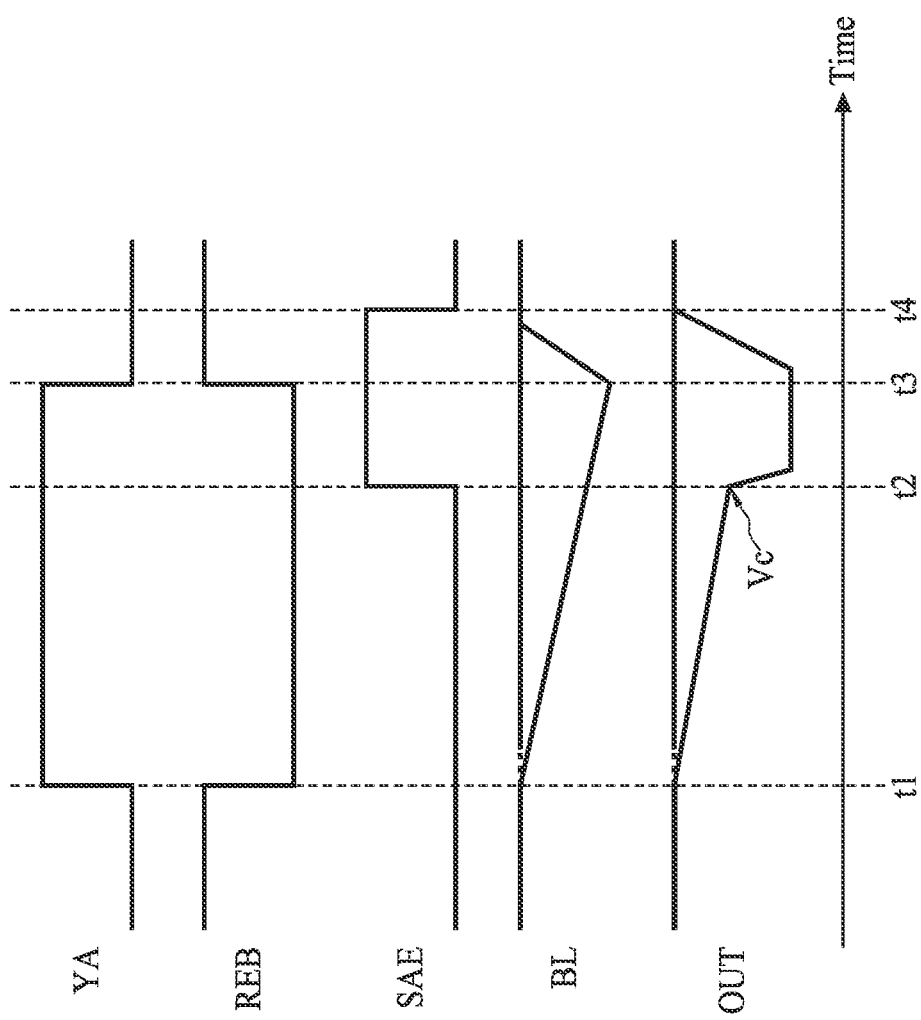
FIG. 6 is a timing diagram illustrating the signal waveforms of a memory device during the reading operation in accordance with some embodiments.

FIG. 6 is a timing diagram illustrating the signal waveforms of a memory device during the reading operation in accordance with some embodiments. The waveforms may be the pre-charge control signal YA, the read enable signal REB, the sensing amplifier activation signal SAE, the bit line signal BL, and the output signal OUT of the memory devices 300 or 500 during the reading operation. When the memory device enters the reading operation for reading the data of a memory cell, the voltage levels of the pre-charge control signal YA and the read enable signal REB are changed to the high voltage level and the low voltage level (for example) from the low voltage level and the high voltage level (for example) at time t1 respectively. When the voltage levels of the pre-charge control signal YA and the read enable signal REB are the high voltage level and the low voltage level respectively, the control circuit 306 and the first precharging and equalizing circuit 3042 precharge the voltage level at the bit lines (i.e. the nodes Na and Nb, Ng and Nh, Ne and Nf) into the high voltage level (for example), i.e. the voltage level of the bit line signal BL at time t1. After time t1, depending on the data stored in the memory cell, the voltage level of one bit line (e.g. the nodes Na, Ng, and Ne) gradually decrease to reach the low voltage level, and the voltage level of the other bit line (e.g. the nodes Nb, Nh, and Nf) are kept intact. At time t2, the voltage level of the sensing amplifier activation signal SAE is changed into the high voltage level from the low voltage level (for example) to sense the voltage level on the bit lines. At time t2, the voltage level (i.e. the output signal OUT) of one output terminal of the sensing amplifier 3054 is changed into the low voltage level from the current voltage level, and the voltage level (i.e. the output signal OUT) of the other output terminal of the sensing amplifier 3054 is kept intact.

It is noted that, during the time interval between the time t1 and t2, the sensing amplifier 3054 may be a voltage follower that follows the voltage level on the bit lines. During the time interval between the time t2 and t3, the sensing amplifier 3054 may output the output signal OUT to the following circuits. At time t3, the voltage levels of the pre-charge control signal YA and the read enable signal REB are changed to the low voltage level and the high voltage level from the high voltage level and the low voltage level to stop the reading operation respectively. In addition, at time t4, the voltage level of the sensing amplifier activation signal SAE changed to the low voltage level from the high voltage level to disable the sensing amplifier 3054.

Figure 7:
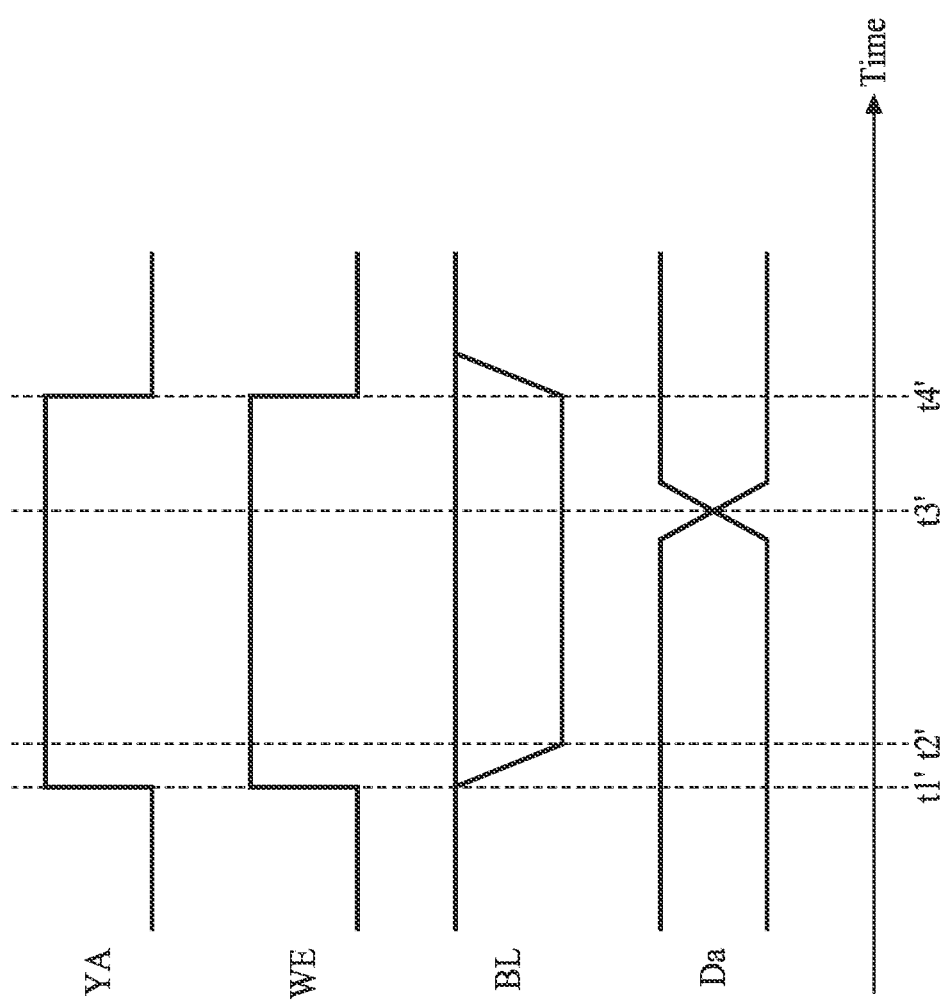
FIG. 7 is a timing diagram illustrating the signal waveforms of a memory device during the writing operation in accordance with some embodiments.

FIG. 7 is a timing diagram illustrating the signal waveforms of a memory device during the writing operation in accordance with some embodiments. The waveforms may be the pre-charge control signal YA, the write enable signal WE, the bit line signal BL, and the memory cell data Da of a memory cell of the memory devices 400 or 500 during the reading operation. When the memory device enters the writing operation for writing the data into the memory cell, the voltage levels of the pre-charge control signal YA and the write enable signal WE are changed to the high voltage level (for example) from the low voltage level (for example) at time t1'. When the voltage levels of the pre-charge control signal YA and the write enable signal WE are the high voltage level, the control circuit 406 and the write driver 4044 drive the voltage level at the bit lines (i.e. the nodes Ng' and Nh', Ne' and Nf') into the high voltage level and the low voltage level respectively (for example) depending on the data to be stored into the memory. For example, during the interval between the time t1' and t2', the voltage level of the nodes Ng' and Ne' gradually reaches the low voltage level, and the voltage level of the nodes Nh' and Nf is kept intact. At time t2', the voltage level of the nodes Ng' and Ne' reaches the low voltage level. At time t3', the memory cell data Da are stored into the memory cell, i.e. the logical state of the memory cell is changed at time t3'. At time t4', the voltage levels of the pre-charge control signal YA and the write enable signal WE are changed to the low voltage level from the high voltage level to stop the reading operation. In addition, at time t4', the voltage levels at the bit lines are changed to the high voltage level.

Figure 8:
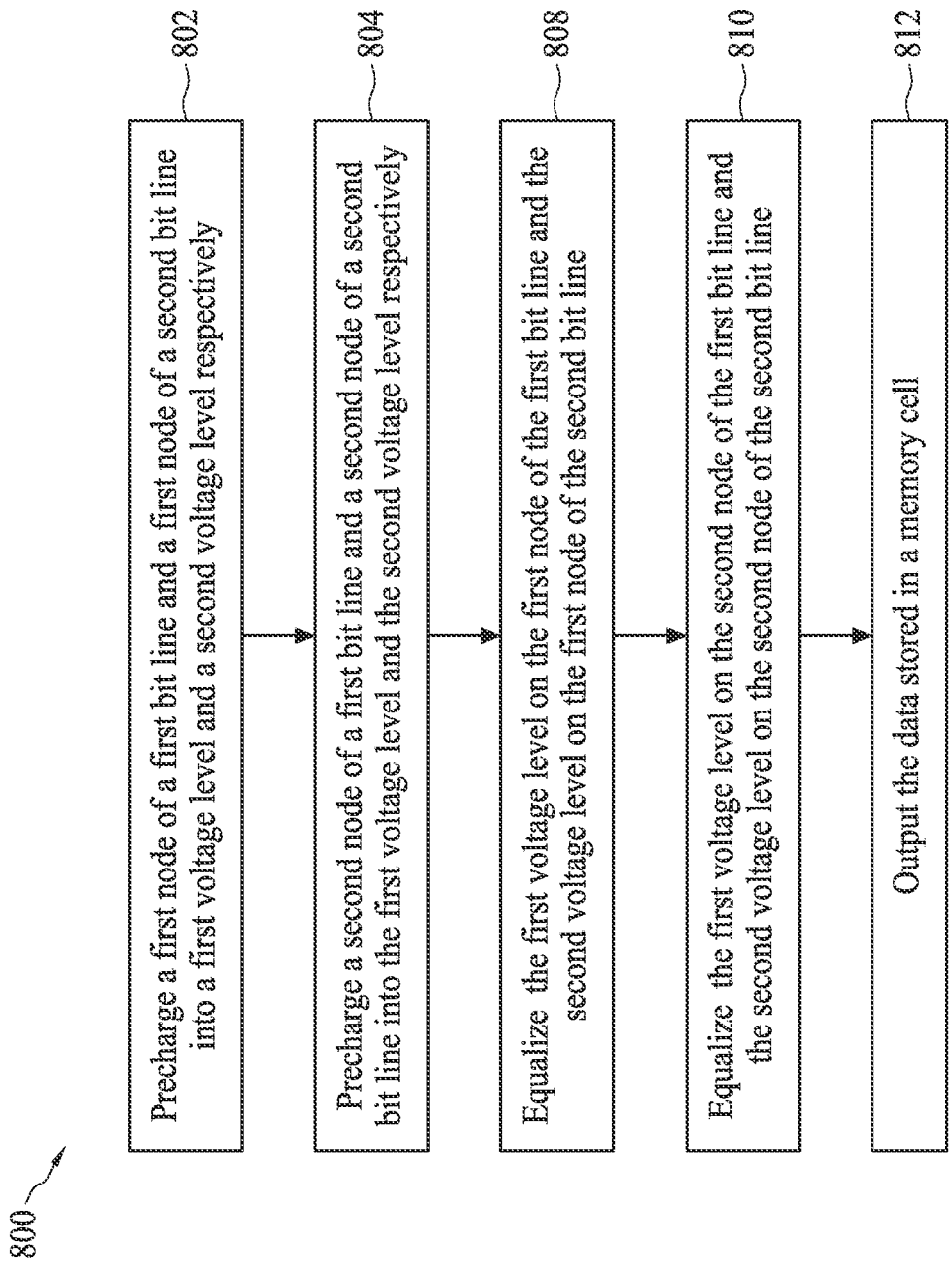
FIG. 8 is a flowchart illustrating a method of reading a memory device in accordance with some embodiments.

FIG. 8 is a flowchart illustrating a method 800 of reading a memory device in accordance with some embodiments. The method 800 may be applied in the reading operation of the memory devices 300 or 500. Therefore, the operations of the method 800 are described based on FIG. 3. The method 800 comprises operations 802-810. In operation 802, a first node (e.g. Ne) of a first bit line (e.g. 312) and a first node (e.g. Nf) of a second bit line (e.g. 314) are precharged into a first voltage level and a second voltage level respectively. The first node of the first bit line and the first node of the second bit line are disposed on a first side of the memory cell array. In operation 804, a second node (e.g. Ng) of the first bit line and a second node (e.g. Nh) of the second bit line are precharged into the first voltage level and the second voltage level respectively. The second node of the first bit line and the second node of the second bit line are disposed on a second side opposite to the first side of the memory cell array. In operation 806, the first voltage level on the first node of the first bit line and the second voltage level on the first node of the second bit line are equalized. In operation 808, the first voltage level on the second node of the first bit line and the second voltage level on the second node of the second bit line are equalized. In operation 810, the data stored in a memory cell with a port connecting to the first bit line and the second bit line is outputted.

Figure 9:
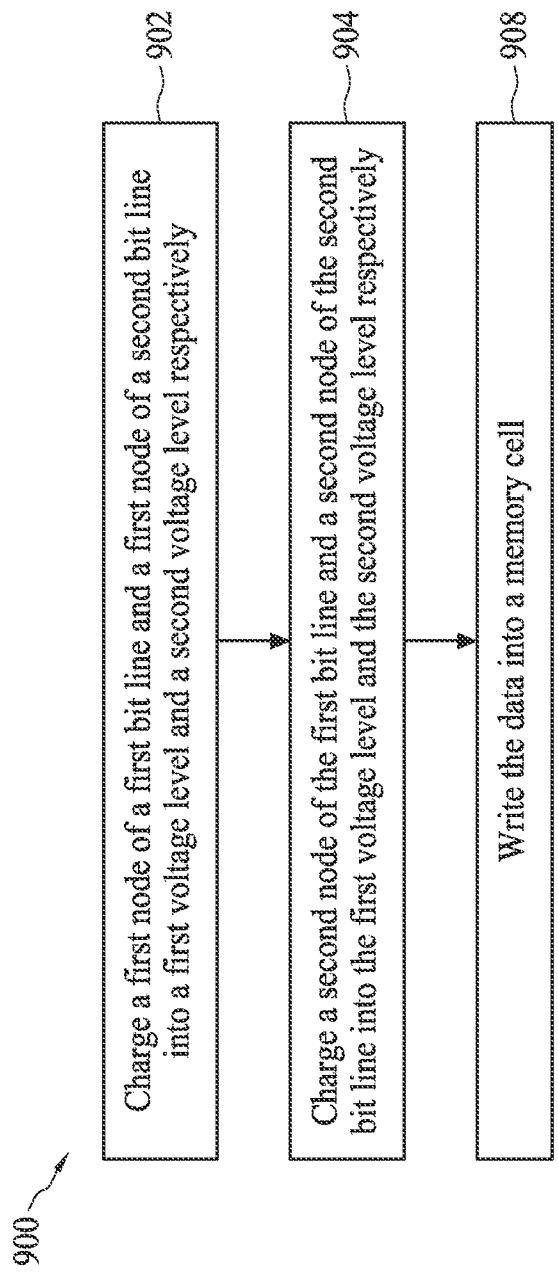
FIG. 9 is a flowchart illustrating a method of writing a memory device in accordance with some embodiments.

FIG. 9 is a flowchart illustrating a method 900 of writing a memory device in accordance with some embodiments. The method 900 may be applied in the writing operation of the memory devices 400 or 500. Therefore, the operations of the method 900 are described based on FIG. 4. The method 900 comprises operations 902-906. In operation 902, a first node (e.g. Ne') of a first bit line (e.g. 412) and a first node (e.g. Nf') of a second bit line (e.g. 414) are charged into a first voltage level and a second voltage level respectively. The first node of the first bit line and the first node of the second bit line are disposed on a first side of the memory cell array. In operation 904, a second node (e.g. Ng') of the first bit line and a second node (e.g. Nh') of the second bit line are charged into the first voltage level and the second voltage level respectively. The second node of the first bit line and the second node of the second bit line are disposed on a second side opposite to the first side of the memory cell array. In operation 906, a data is wrote into the memory cell with a port connecting to the first bit line and the second bit line.

Briefly, in the present embodiments, when the bit lines of a memory cell is simultaneously controlled by a control circuit disposed on a side of the memory cell array and a feedback control circuit disposed on the opposite side of the memory cell array, the writing time and the cycle time of the memory cell may be reduced.

According to some embodiments, a memory device is provided. The memory device comprises a memory cell array, a first control circuit, and a second control circuit. The memory cell array has a plurality of memory cells, wherein each of the plurality of memory cells comprises a first port and a second port. The first control circuit is disposed on a first side of the memory cell array and is arranged to electrically connect to the plurality of first ports. The second control circuit is disposed on the first side of the memory cell array and is arranged to electrically connect to the plurality of second ports. The plurality of first ports are different from the plurality of second ports.

According to some embodiments, a memory device is provided. The memory device includes a memory cell array, a first control circuit, a second control circuit, a third control circuit, a fourth control circuit, and a first bit line. The memory cell array may have a plurality of memory cells. Each of the memory cells may include a first port and a second port. The first port may include a first connecting node. The first control circuit may be disposed on a first side of the memory cell array and arranged to electrically connect to the plurality of first ports. The second control circuit may be disposed on a second side of the memory cell array and arranged to electrically connect to the plurality of first ports. The second side may be opposite to the first side of the memory cell array. The third control circuit may be disposed on the second side of the memory cell array and arranged to electrically connect to the plurality of second ports. The fourth control circuit may be disposed on the first side of the memory cell array and arranged to electrically connect to the plurality of second ports. The first bit line may be extended from the first side to the second side, for electrically connecting the first control circuit, the first connecting node, and the second control circuit. The first control circuit may include a first precharger, coupled to a first node of the first bit line, for precharging the first node of the first bit line during a reading operation of the memory device.

According to some embodiments, a method of controlling a memory device is provided. The method comprises: precharging a first node of a first bit line into a first voltage level during a reading operation, wherein the first bit line extends from a first side of a memory cell array in the memory device to a second side of the memory cell array, the second side is opposite to the first side of the memory cell array, and the first bit line electrically connects to a plurality of memory cells in the memory cell array; precharging a first node of a second bit line into a second voltage level during the reading operation, wherein the second bit line extends from the first side of the memory cell array to the second side of the memory cell array, and the second bit line electrically connects to the plurality of memory cells in the memory cell array; precharging a second node of the first bit line into the first voltage level during the reading operation; and precharging a second node of the second bit line into the second voltage level during the reading operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell array, having a plurality of memory cells, wherein each of the plurality of memory cells comprises a first port and a second port, wherein the first port comprises a first connecting node and a second connecting node, and wherein the second port comprises a third connecting node and a fourth connecting node;
a first control circuit, disposed on a first side of the memory cell array and arranged to electrically connect to the plurality of first ports;
a second control circuit, disposed on a second side of the memory cell array and arranged to electrically connect to the plurality of first ports, wherein the second side is opposite to the first side of the memory cell array;
a third control circuit, disposed on the second side of the memory cell array and arranged to electrically connect to the plurality of second ports;
a first bit line electrically connecting the first control circuit, the first connecting node of the first port of each of the plurality of memory cells, and the second control circuit;
a second bit line electrically connecting the first control circuit, the second connecting node of the first port of each of the plurality of memory cells, and the second control circuit;
a third bit line electrically connecting the third control circuit and the third connecting node of the second port of each of the plurality of memory cells;
a fourth bit line electrically connecting the third control circuit and the fourth connecting node of the second port of each of the plurality of memory cells; and
a first conductive line extending from the first side to the second side and electrically connecting the first control circuit and the second control circuit, wherein the first control circuit is configured to control the second control circuit via the first conductive line.

2. The memory device of claim 1, wherein the memory device further comprises:
a fourth control circuit, disposed on the first side of the memory cell array and arranged to electrically connect to the plurality of second ports,
wherein the second control circuit is disposed between the memory cell array and the third control circuit, and the fourth control circuit is disposed between the memory cell array and the first control circuit.

3. The memory device of claim 2, further comprising:
a second conductive line, extended from the first side to the second side, for electrically connecting the third control circuit and the fourth control circuit, wherein the third control circuit is configured to control the fourth control circuit via the second conductive line.

4. The memory device of claim 2, wherein:
the third bit line electrically connects the third control circuit, the third connecting node, and the fourth control circuit; and
the fourth bit line electrically connects the third control circuit, the fourth connecting node, and the fourth control circuit.

5. The memory device of claim 1, wherein the first control circuit comprises:
a first precharger, coupled to a first node of the first bit line and a first node of the second bit line, for precharging the first node of the first bit line and the first node of the second bit line during a reading operation of the memory device.

6. The memory device of claim 5, wherein the second control circuit comprises:
a second precharger, coupled to a second node of the first bit line and a second node of the second bit line, for precharging the second node of the first bit line and the second node of the second bit line during the reading operation of the memory device.

7. The memory device of claim 5, wherein the first control circuit comprises:
a first driver, coupled to the first node of the first bit line and the first node of the second bit line, for driving the first node of the first bit line and the first node of the second bit line during a writing operation of the memory device.

8. The memory device of claim 7, wherein the first control circuit comprises:
a first equalizer, coupled to the first node of the first bit line and the first node of the second bit line, for equalizing a first voltage level on the first node of the first bit line and a second voltage level on the first node of the second bit line.

9. The memory device of claim 7, wherein the second control circuit comprises:
a second driver, coupled to a second node of the first bit line and a second node of the second bit line, for driving the second node of the first bit line and the second node of the second bit line during the writing operation of the memory device.

10. The memory device of claim 9, wherein the first control circuit comprises:
a first equalizer, coupled to the first node of the first bit line and the first node of the second bit line, for equalizing a first voltage level on the first node of the first bit line and a second voltage level on the first node of the second bit line; and
wherein the second control circuit comprises:
a second equalizer, coupled to the second node of the first bit line and the second node of the second bit line, for equalizing a first voltage level on the second node of the first bit line and a second voltage level on the second node of the second bit line.

11. The memory device of claim 1, further comprising:
a second conductive line extending from the second side to the first side and electrically connecting the third control circuit and the fourth control circuit.

12. A memory device, comprising:
a memory cell array, having a plurality of memory cells, wherein each of the plurality of memory cells comprises a first port and a second port, wherein the first port comprises a first connecting node and a second connecting node, and wherein the second port comprises a third connecting node and a fourth connecting node;
a first control circuit, disposed on a first side of the memory cell array and arranged to electrically connect to the plurality of first ports of the plurality of memory cells; and
a second control circuit, disposed on a second side of the memory cell array and arranged to electrically connect to the plurality of first ports of the plurality of memory cells, wherein the second side is opposite to the first side of the memory cell array;
a third control circuit, disposed on the second side of the memory cell array and arranged to electrically connect to the plurality of second ports of the plurality of memory cells;
a fourth control circuit, disposed on the first side of the memory cell array and arranged to electrically connect to the plurality of second ports of the plurality of memory cells;
a first bit line, extending from the first side to the second side, for electrically connecting the first control circuit, the first connecting node, and the second control circuit;
a second bit line, extending from the first side to the second side, for electrically connecting the first control circuit, the second connecting node, and the second control circuit;
a third bit line, extending from the first side to the second side, for electrically connecting the third control circuit, the third connecting node, and the fourth control circuit;
a fourth bit line, extending from the first side to the second side, for electrically connecting the third control circuit, the fourth connecting node, and the fourth control circuit; and
a first conductive line extending from the first side to the second side and electrically connecting the first control circuit and the second control circuit, wherein the first control circuit is configured to control the second control circuit via the first conductive line,
wherein the first control circuit comprises:
a first precharger, coupled to a first node of the first bit line and a first node of the second bit line, for precharging the first node of the first bit line and the first node of the second bit line during a reading operation of the memory device.

13. The memory device of claim 12, wherein the second control circuit comprises:
a second precharger, coupled to a second node of the first bit line and a second node of the second bit line, for precharging the second node of the first bit line and the second node of the second bit line during the reading operation of the memory device.

14. The memory device of claim 13, wherein the second control circuit comprises:
a second equalizer, coupled to the second node of the first bit line and the second node of the second bit line, for equalizing a first voltage level on the second node of the first bit line and a second voltage level on the second node of the second bit line.

15. The memory device of claim 12, wherein the first control circuit comprises:
a first driver, coupled to the first node of the first bit line and the first node of the second bit line, for driving the first node of the first bit line and the first node of the second bit line during a writing operation of the memory device.

16. The memory device of claim 15, wherein the first control circuit comprises:
a first equalizer, coupled to the first node of the first bit line and the first node of the second bit line, for equalizing a first voltage level on the first node of the first bit line and a second voltage level on the first node of the second bit line.

17. The memory device of claim 16, wherein the second control circuit comprises:
a second driver, coupled to a second node of the first bit line and a second node of the second bit line, for driving the second node of the first bit line and the second node of the second bit line during the writing operation of the memory device.

18. A memory device, comprising:
a memory cell array, having a plurality of memory cells, wherein each of the plurality of memory cells comprises a first port and a second port different from the first port, wherein the first port comprises a first connecting node and a second connecting node, and wherein the second port comprises a third connecting node and a fourth connecting node;
a first control circuit, disposed on a first side of the memory cell array and arranged to electrically connect to the plurality of first ports;
a second control circuit, disposed on a second side of the memory cell array and arranged to electrically connect to the plurality of first ports, wherein the second side is opposite to the first side of the memory cell array;
a third control circuit, disposed on the second side of the memory cell array and arranged to electrically connect to the plurality of second ports;
a first bit line, extending from the first control circuit to the memory cell array, for electrically connecting the first control circuit and the first connecting node of the first port of each of the plurality of memory cells;
a second bit line, extending from the first control circuit to the memory cell array, for electrically connecting the first control circuit and the second connecting node of the first port of each of the plurality of memory cells;
a third bit line, extending from the third control circuit to the memory cell array, for electrically connecting the third control circuit and the third connecting node of the second port of each of the plurality of memory cells;
a fourth bit line, extending from the third control circuit to the memory cell array, for electrically connecting the third control circuit and the fourth connecting node of the second port of each of the plurality of memory cells;
a first conductive line extending from the first side to the second side and electrically connecting the first control circuit and the second control circuit, wherein the first control circuit is configured to control the second control circuit via the first conductive line; and a latching circuit arranged to latch a voltage on one of the first bit line and the second bit line into a supply voltage level.

19. The memory device of claim 18, wherein the memory device further comprises:
a fourth control circuit, disposed on the first side of the memory cell array and arranged to electrically connect to the plurality of second ports.

20. The memory device of claim 19, further comprising:
a second conductive line, extended from the second side to the first side, for electrically connecting the third control circuit and the fourth control circuit.

* * * * *